United States Patent
Watanabe et al.

(10) Patent No.: US 7,847,572 B2
(45) Date of Patent: Dec. 7, 2010

(54) TEST SYSTEM, ELECTRONIC DEVICE, AND TEST APPARATUS

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/257,396

(22) Filed: Oct. 24, 2008

(65) Prior Publication Data

US 2009/0295417 A1 Dec. 3, 2009

Related U.S. Application Data

(60) Provisional application No. 61/057,871, filed on Jun. 1, 2008.

(51) Int. Cl.
*G01R 31/28* (2006.01)
(52) U.S. Cl. ..................... 324/763; 324/765
(58) Field of Classification Search ......... 324/754–765; 714/699, 716
See application file for complete search history.

(56) References Cited

U.S. PATENT DOCUMENTS

| | | | | |
|---|---|---|---|---|
| 5,920,600 | A * | 7/1999 | Yamaoka et al. | 375/376 |
| 6,584,592 | B2 * | 6/2003 | Omura et al. | 714/733 |
| 6,587,979 | B1 * | 7/2003 | Kraus et al. | 714/720 |
| 6,825,052 | B2 * | 11/2004 | Eldridge et al. | 438/15 |
| 7,159,145 | B2 * | 1/2007 | Wang et al. | 714/36 |
| 7,246,025 | B2 * | 7/2007 | Heaton et al. | 702/117 |
| 7,570,664 | B2 * | 8/2009 | Shimosakoda | 370/503 |
| 2005/0120270 | A1 * | 6/2005 | Anand et al. | 714/30 |
| 2010/0007366 | A1 * | 1/2010 | Watanabe et al. | 324/763 |

FOREIGN PATENT DOCUMENTS

| | | |
|---|---|---|
| JP | 2001-305188 | 10/2001 |
| JP | 2002-184948 | 6/2002 |
| JP | 2003-45199 | 2/2003 |
| JP | 2006-107590 | 4/2006 |
| JP | 2006-258703 | 9/2006 |
| JP | 2007-107930 | 4/2007 |
| JP | 2008-102081 | 5/2008 |

OTHER PUBLICATIONS

"Search report of PCT counterpart application", issued on Aug. 18, 2009, p. 1-p. 3.

* cited by examiner

*Primary Examiner*—Ha Tran T Nguyen
*Assistant Examiner*—Richard Isla Rodas
(74) *Attorney, Agent, or Firm*—Jianq Chyun IP Office

(57) ABSTRACT

Provided is a test system that tests a device under test, including a plurality of internal test circuits that are provided inside the device under test and that are used for testing an operation circuit of the device under test; a device control section that is electrically connected to the plurality of internal test circuits via a common bus and that controls the plurality of internal test circuits by supplying the common bus with an intra-device control signal corresponding to a received external signal; and a test apparatus that supplies the device control section with the external signal.

7 Claims, 11 Drawing Sheets ns that we claim. Also, all the combinations of features described in the embodiments are not necessarily essential to means provided by aspects of the invention.

TEST SYSTEM, ELECTRONIC DEVICE, AND TEST APPARATUS

CROSS REFERENCE TO RELATED APPLICATION

The present application claims priority from a provisional application No. 61/057,871 filed on Jun. 1, 2008, the contents of which are incorporated herein by reference.

BACKGROUND

1. Technical Field

The present invention relates to a test system, an electronic device, and a test apparatus.

2. Related Art

A known method for testing a semiconductor device involves using a BIST circuit. By using a BIST circuit housed in the semiconductor device to test the semiconductor device, a device under test can be tested without using a test apparatus. For example, signals are input and output at relatively low frequencies between a test apparatus provided externally to the semiconductor device and the BIST circuit, so that the BIST circuit can test the semiconductor device or receive a test result.

The effectiveness of the BIST circuit is determined by the performance of the BIST circuit testing the logic circuit in the semiconductor device and the BIST circuit testing a memory circuit. BIST circuits are expected to be used in various tests in the future, such as analog circuit tests.

Therefore, in an SoC or SiP having a monolithic memory circuit, logic circuit, analog circuit, and the like, various types of BIST circuits must be included to test the variety of circuits. In particular, with advances in the miniaturization of semiconductor processes, decreasing the area occupied by a single BIST circuit in a semiconductor device enables more BIST circuits to be included in the semiconductor device.

However, when several types of BIST circuits are provided in a semiconductor device, it becomes difficult for an external test apparatus to control each BIST circuit. Furthermore, a test pin for controlling the BIST circuit must be provided for each BIST circuit. In addition, when testing a semiconductor device in which the BIST circuits are aligned with the test circuits of the external test apparatus, the plurality of BIST circuits must be synchronized with the signals from the test circuits, making control even more difficult.

SUMMARY

Therefore, it is an object of an aspect of the innovations herein to provide a test system, an electronic device, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test system may include a test system that tests a device under test, comprising a plurality of internal test circuits that are provided inside the device under test and that are used for testing an operation circuit of the device under test; a device control section that is electrically connected to the plurality of internal test circuits via a common bus and that controls the plurality of internal test circuits by supplying the common bus with an intra-device control signal corresponding to a received external signal; and a test apparatus that supplies the device control section with the external signal.

According to a second aspect related to the innovations herein, one exemplary electronic device may include an operation circuit that operates according to an input signal; a plurality of internal test circuits that are provided inside the electronic device and that test the operation circuit; and a device control section that is electrically connected to the plurality of internal test circuits via a common bus and that controls the plurality of internal test circuits by supplying the common bus with an intra-device control signal corresponding to a received external signal.

According to a third aspect related to the innovations herein, one exemplary test apparatus may include a test apparatus that tests a device under test. The device under test includes a plurality of internal test circuits that are provided inside the device under test and that are used to test an operation circuit of the device under test; and a device control section that is electrically connected to the plurality of internal test circuits via a common bus and that controls the plurality of internal test circuits by supplying the common bus with an intra-device control signal corresponding to a received external signal. The test apparatus includes a tester-side control section that supplies the device control section with the external signal; a test circuit that tests the operation circuit; and a synchronization control section that causes the test circuit and the internal test circuits to operate in synchronization.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
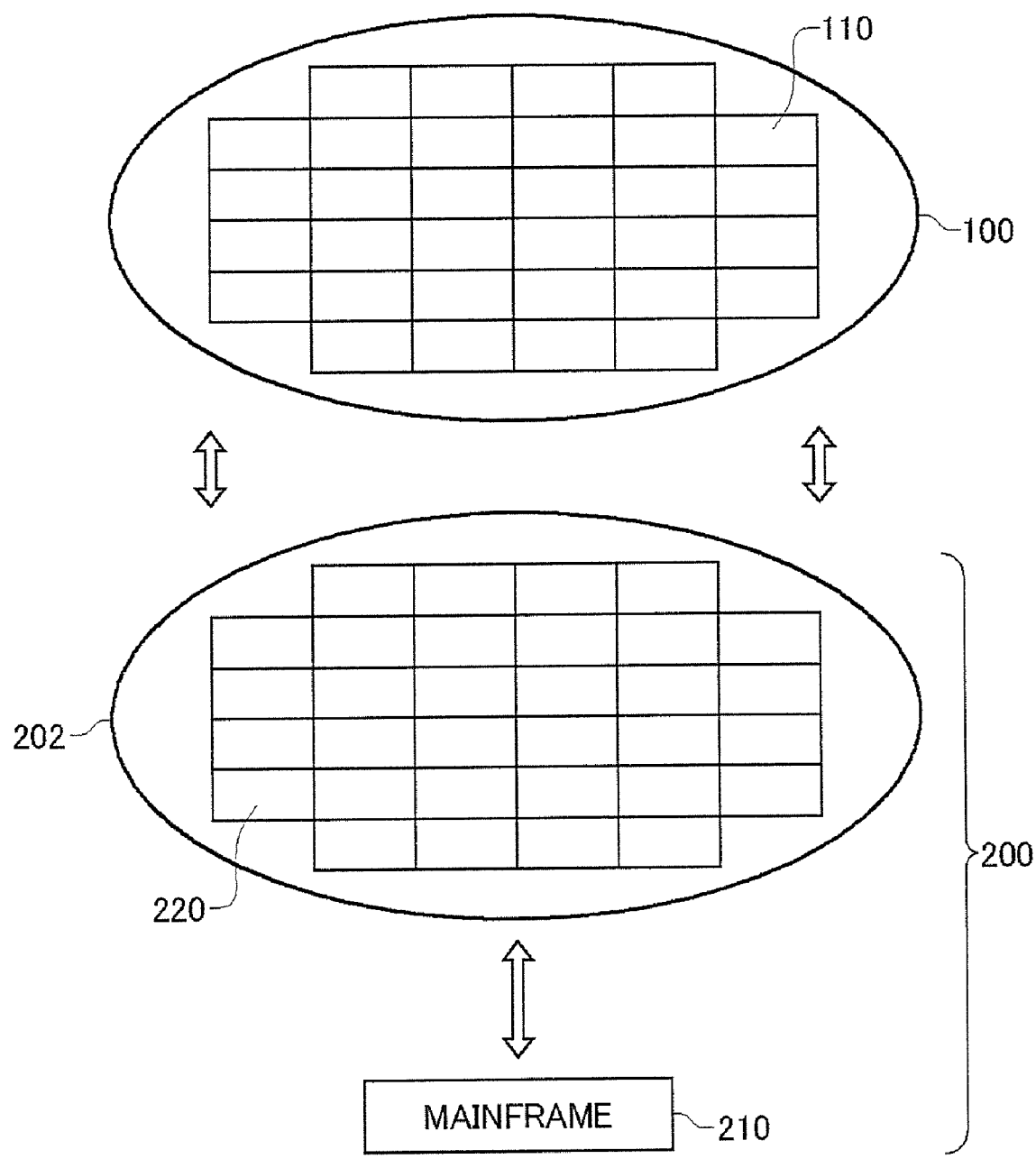
FIG. 1 shows an exemplary configuration of a test system 10 according to an embodiment of the present invention.

FIG. 1 shows an exemplary configuration of a test system 10 according to an embodiment of the present invention. The test system 10 tests a device under test 110 such as a semiconductor circuit, and is provided with an internal test circuit and a test apparatus 200. The test system 10 of the present embodiment tests in parallel a plurality of devices under test 110 formed in a wafer under test 100.

The test apparatus 200 includes a test substrate 202 and a mainframe 210. The test substrate 202 may be arranged facing the wafer under test 100, and may be electrically connected to the plurality of devices under test 110 en masse. A plurality of circuit blocks 220 are formed on the test substrate 202 to correspond one-to-one with the plurality of devices under test 110. Each circuit block 220 is electrically connected to the corresponding device under test 110 and tests this device under test 110.

The test substrate 202 may be a wafer formed of the same semiconductor material as the wafer under test 100. For example, the test substrate 202 is a silicon substrate. The test substrate 202 may be formed of a semiconductor material having substantially the same thermal expansion coefficient as the substrate of the wafer under test 100. For example, the test substrate 202 is a print substrate.

The test substrate 202 of the present embodiment may have substantially the same shape as the wafer under test 100. For example, the test substrate 202 is a disc-shaped substrate having a diameter substantially equal to that of the wafer under test 100. The test substrate 202 may instead be a substrate such as a socket board onto which the device under test 110 is mounted. The following description uses an example in which the test substrate 202 has substantially the same shape as the wafer under test 100 and is arranged facing the wafer under test 100.

Each circuit block 220 may be formed in a region of the test substrate 202 that is aligned with the region of the corresponding device under test 110 formed on the wafer under test 100. For example, the circuit blocks 220 may be formed such that the region in which the circuit blocks 220 are formed overlaps with the region in which the devices under test 110 are formed when the test substrate 202 and the wafer under test 100 overlap.

The devices under test 110 and the circuit blocks 220 may be provided on the sides of the wafer under test 100 and the test substrate 202 that face each other. The circuit blocks 220 may instead be formed on the side of the test substrate 202 that does not face the wafer under test 100. In this case, the circuit blocks 220 may be electrically connected to the devices under test 110 through via holes formed in the test substrate 202.

Here, "electrically connected" refers to a state in which electrical signals can be transmitted between two components. For example, the circuit blocks 220 and the devices under test 110 have I/O pads that directly contact each other, or are electrically connected by indirect contact via another semiconductor. For example, the test system 10 may be provided with a probe such as a membrane sheet between the wafer under test 100 and the test substrate 202 that has a diameter substantially equal to that of the wafers. The membrane sheet has bumps that electrically connect the I/O pads of corresponding circuit blocks 220 and devices under test 110. The test system 10 may be provided with an anisotropically conductive sheet between the membrane sheet and the test substrate 202.

The I/O pads of the circuit blocks 220 and the devices under test 110 may be electrically connected without contacting each other, through capacitance coupling (also known as electrostatic coupling), inductive coupling (also known as magnetic coupling), or the like. A portion of the transmission lines between the I/O pads of the circuit blocks 220 and the devices under test 110 may be optical transmission lines.

Since the test substrate 202 is formed of the same semiconductor material as the wafer under test 100, the test substrate 202 of the present embodiment can maintain a good electrical connection with the wafer under test 100 even if the surrounding temperature changes. Therefore, even if the testing heats the wafer under test 100, for example, the wafer under test 100 can be accurately tested.

If the test substrate 202 is formed of a semiconductor material, the circuit blocks 220 can easily be formed densely on the test substrate 202. For example, the circuit blocks 220 can easily be formed densely on the test substrate 202 by a semiconductor process using exposure or the like. Therefore, a large number of circuit blocks 220 corresponding to a large number of devices under test 110 can be formed on the test substrate 202 relatively easily.

Providing the circuit blocks 220 on the test substrate 202 decreases the size of the mainframe 210. For example, the mainframe 210 may have a function for notifying the circuit blocks 220 about the timing of the test initiation or the like, a function for reading the test results of the circuit blocks 220, and a function for supplying driving power to the circuit blocks 220 and the devices under test 110. The mainframe 210 may use a PC or the like to control each circuit block 220.

Figure 2:
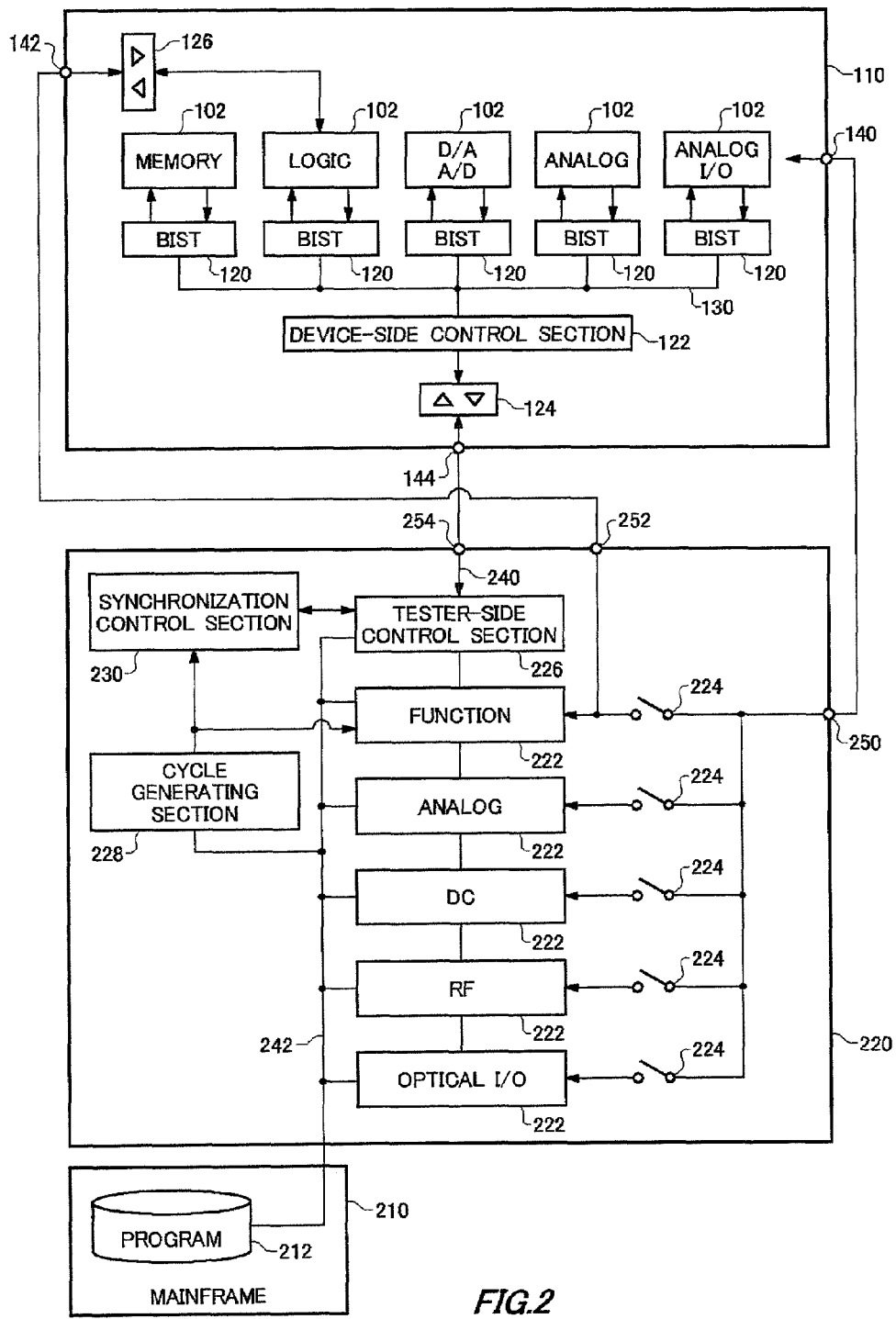
FIG. 2 shows exemplary configurations of a device under test 110 and a circuit block 220.

FIG. 2 shows exemplary configurations of a device under test 110 and a circuit block 220. The device under test 110 includes a plurality of operation circuits 102, a plurality of BIST circuits 120, a device control section 122, an interface 124, an interface 126, an operation pin 140, an operation pin 142, and a test pin 144. The BIST circuits 120 are an example of the internal test circuits that are housed in the device under test 110 and used to test the operation circuits 102.

The interface 124 is provided between the test pin 144 and the device control section 122, and performs input and output of signals. For example, the device control section 122 receives an external signal from the circuit block 220 via the test pin 144 and the interface 124. The device control section 122 may also output the test result of the BIST circuit 120 to the circuit block 220 via the test pin 144 and the interface 124.

The interface 126 is provided between the operation pin 142 and the operation circuit 102, and performs input and output of signals. The operation pin 142 may be a digital I/O pin, and the interface 126 may perform input and output of digital signals between the operation pin 142 and the operation circuit 102 including a logic circuit. The interface 124 and the interface 126 may be buffer circuits.

The operation pin 140 may be an analog I/O pin, a high speed I/F pin, an optical I/O, or the like. The operation pin 140 performs input and output of signals between the operation circuit 102 and a section outside of the device under test 110. If the device under test 110 is implemented in a product, the operation pin 140 may be a pin that is electrically connected to another circuit within the product. During testing of the device under test 110, the operation pin 140 performs input and output of analog signals, high frequency signals, optical signals, or the like between the circuit block 220 and the operation circuit 102.

The test pin 144 performs input and output of signals between the device control section 122 and a section outside of the device under test 110. When the device under test 110 is implemented in a product, the test pin 144 may be an unused pin. During testing of the device under test 110, the test pin 144 is electrically connected to the test apparatus 200.

Each operation circuit 102 performs a prescribed operation when the device under test 110 is implemented. For example, each operation circuit 102 may serve as a memory circuit that stores data supplied thereto, a logic circuit that outputs a digital signal according to a digital signal supplied thereto, an A/D conversion circuit that converts a digital signal supplied thereto into an analog signal, a D/A conversion circuit that converts an analog signal supplied thereto into a digital signal, an analog circuit that outputs an analog signal according to an analog signal supplied thereto, an analog I/O circuit that performs input and output of an analog signal with a section outside of the device under test 110, or the like.

The plurality of BIST circuits 120 correspond respectively to the plurality of operation circuits 102. Each BIST circuit 120 tests whether the corresponding operation circuit 102 is operating correctly. For example, each BIST circuit 120 judges whether the corresponding operation circuit 102 is operating correctly based on whether the operation circuit 102 outputs a prescribed signal upon receiving a prescribed test signal.

The device control section 122 is electrically connected to the plurality of BIST circuits 120 via the common bus 130. The device control section 122 supplies the common bus 130 with an intra-device control signal corresponding to an external signal supplied thereto, such that the operation circuits 102 are each tested individually by the corresponding BIST circuit 120.

Each BIST circuit 120 tests the corresponding operation circuit 102 and generates a digital test result signal according to the test result. Each test result signal may be a result of a judgment as to whether the target operation circuit 102 is defective, or may be intermediate data acquired from the testing process.

The content of each test by a BIST circuit 120 is set according to the content of the signal processing performed by the corresponding operation circuit 102. For example, the BIST circuit 120 corresponding to an operation circuit 102 that includes a memory circuit or a logic circuit may include a conventional boundary scan test circuit.

However, a conventional boundary scan test circuit cannot test an operation circuit 102 having a D/A conversion circuit, an A/D conversion circuit, an analog circuit, an analog I/O circuit, or the like. Therefore, the device under test 110 includes a plurality of types of BIST circuits 120 to correspond to a plurality of types of operation circuits 102.

The device under test 110 of the present embodiment simplifies control of these BIST circuits 120 by using a common intra-device control signal and performing control via the common bus 130. For example, the intra-device control signal includes a designation bit that designates a certain BIST circuit 120, an input bit that indicates the input data to be supplied to the designated BIST circuit 120, an output bit that designates the output data output from the designated BIST circuit 120, a clock bit that indicates a clock supplied to the designated BIST circuit 120, and an enable bit that indicates the timing at which the designated BIST circuit 120 begins operating.

The bit arrangement of the intra-device control signal is set in advance. Each BIST circuit 120 judges whether it is designated by the intra-device control signal based on the value of the designation bit. When a BIST circuit 120 judges that it is designated by the designation bit, this BIST circuit 120 operates according to the intra-device control signal to test the corresponding operation circuit 102.

The input data in the intra-device control signal includes an address, pattern data, and the like for controlling the operation of the BIST circuit 120 at a prescribed bit position. The device control section 122 outputs the intra-device control signal having the prescribed bit arrangement based on the external signal supplied thereto, to enable designation of a plurality of BIST circuits 120. In this case, the plurality of operation circuits 102 corresponding to the plurality of BIST circuits 120 can be tested simultaneously. The plurality of operation circuits 102 can be tested in series instead.

The following describes the configuration of a circuit block 220. The circuit block 220 includes a plurality of test circuits 222, a tester-side control section 226, a cycle generating section 228, a synchronization control section 230, a tester bus 242, a common bus 240, a switching section 224, an I/O pin 250, an I/O pin 252, and an I/O pin 254.

The plurality of test circuits 222 are electrically connected to the operation pin 140 of the device under test 110 via the switching sections 224 and the I/O pin 250. The test circuits 222 may test the operation circuits 102 by performing input and output of signals with the operation circuits 102. Each test circuit 222 may have a different test function. For example, a test circuit 222 may have a function for performing a function test, an analog test, a direct current test, a high frequency test, or an optical I/O test of the corresponding operation circuit 102.

Each test circuit 222 may have the same test functions as a known test apparatus. Each test circuit 222 may operate based on a test program supplied from the mainframe 210 and the program storage section 212 via the tester bus 242. These test programs may include data indicating a waveform pattern or a bit pattern of the test signal to be generated by the test circuit 222, data indicating the cycle or phase of the test signal, or the like.

The switching sections 224 select certain test circuits 222 to be electrically connected to the operation pin 140 of the device under test 110. Each selected test circuit 222 inputs a prescribed signal into the corresponding operation circuit 102 via the operation pin 140. Each of these test circuits 222 also receives a signal output by the corresponding operation circuit 102 via the operation pin 140, and judges whether the operation circuit 102 is operating correctly based on the received signal. The operation pin 140 may be an analog pin, a high speed digital pin, or the like.

A test circuit 222 performing a function test inputs a digital signal having a prescribed pattern into the device under test 110. The corresponding operation circuit 102 of the device under test 110 outputs a response signal, which is obtained by performing a prescribed signal process on the received test signal, to the test circuit 222. The test circuit 222 judges whether the device under test 110 is operating correctly based on the response signal.

For example, the test circuit 222 performing the function test tests an operation circuit 102 including a memory circuit or a logic circuit via the operation pin 142. In this case, the test circuit 222 inputs a digital test signal having a prescribed test pattern into the operation circuit 102. The operation circuit 102 performs a prescribed operation according to the test signal and outputs the response signal corresponding to the operation result. The test circuit 222 judges whether the operation circuit 102 is operating correctly based on the response signal.

Furthermore, the test circuit 222 performing the function test may also perform a function test of the interface 124. In this case, the test circuit 222 may access the test pin 144 via the tester-side control section 226.

A test circuit 222 performing an analog test tests whether the corresponding operation circuit 102 is operating correctly by performing input and output of an analog signal with the operation circuit 102 via the operation pin 140. A test circuit 222 performing a high frequency test tests whether the corresponding operation circuit 102 is operating correctly by performing input and output of a relatively high frequency signal with the operation circuit 102 via the operation pin 140. A test circuit 222 performing an optical I/O test tests whether the corresponding operation circuit 102 is operating correctly by performing input and output of an optical signal with the operation circuit 102 via the operation pin 140.

A test circuit 222 used for an analog test may convert a digital signal output by a test circuit 222 used for a function test into an analog signal, and supply the analog signal to the operation circuit 102. In this way, a prescribed waveform is generated. Furthermore, the test circuit 222 used for the analog test may convert the signal received from the operation circuit 102 into a digital signal, and supply the digital signal to the test circuit 222 used for the function test.

A test circuit 222 performing a direct current test measures a DC level of the current or the voltage supplied to the device under test 110 from the operation pin 140. This test circuit 222 judges whether the device under test 110 is operating correctly based on whether the measured value is within a prescribed range. In this case, the test circuit 222 may measure the current or the voltage supplied to the device under test 110 while the test circuit 222 performing the function test supplies a test signal having a prescribed pattern to the operation circuit 102 including a logic circuit or the like, for example. Furthermore, the test circuit 222 used for the direct current test may measure the DC level of the current or the voltage supplied to the device under test 110 via the operation pin 142 or the test pin 144.

The tester-side control section 226 supplies the device control section 122 with an external signal based on the test program supplied from the mainframe. The test program may include BIST test instructions causing the BIST circuits 120 to test the operation circuits 102, BIST designation instructions that designate certain BIST circuits 120, data portions indicating patterns to be supplied to the BIST circuits 120, cycle designation instructions that designate a test cycle, enable instructions indicating the timing at which the BIST circuits 120 begin operation, and the like.

The tester-side control section 226 generates the external signal supplied to the device control section 122, based on the data and instructions included in the test programs. The external signal may have the same content as the intra-device control signal described above. For example, the tester-side control section 226 generates a serial data intra-device control signal and outputs this signal as the external signal. The interface 124 or the device control section 122 may convert the external signal into parallel data.

In this way, the plurality of BIST circuits 120 test the plurality of operation circuits 102. The tester-side control section 226 receives the test result of the corresponding operation circuit 102 from the device control section 122. The tester-side control section 226 of the present embodiment is electrically connected to the device control section 122 via the common bus 240, the I/O pin 254, the test pin 144, and the interface 124.

The tester-side control section 226 is electrically connected to the test circuits 222 via the common bus 240. If the BIST circuits 120 and the test circuits 222 operate together to test the operation circuits 102, the tester-side control section 226 may perform input and output of signals with the device control section 122 in parallel to control each test circuit 222 via the common bus 240.

The tester-side control section 226 may generate an intra-tester control signal that controls each test circuit 222 based on the test programs received from the mainframe. For example, a test program may include control instructions that cause the tester-side control section 226 to control the test circuits 222, designation instructions that designate certain test circuits 222, data portions indicating patterns to be supplied to the test circuits 222, cycle designation instructions that designate a test cycle, enable instructions indicating the timing at which the test circuits 222 begin operation, and the like.

The tester-side control section 226 generates the intra-tester control signal supplied to the test circuits 222 based on the instructions and data included in the test program. The intra-tester control signal may have the same content as the intra-device control signal described above. It should be noted that the intra-tester control signal may designate a certain test circuit 222 with a certain designation bit.

The intra-tester control signal may designate a plurality of test circuits 222 with a certain designation bit. For example, the intra-tester control signal may designate each test circuit 222 for one or more of the operation pin 140, the operation pin 142, and the test pin 144.

In this way, the test circuits 222 can test the operation circuits 102 via the tester-side control section 226. Specifically, the tester-side control section 226 controls both the BIST circuits 120 and the test circuits 222, so that the operation of the BIST circuits 120 and the test circuits 222 can be easily synchronized. Therefore, the BIST circuits 120 and the test circuits 222 can work together to test the operation circuits 102, enabling the performance of a large variety of tests.

Furthermore, various types of BIST circuits 120 and test circuits 222 can be controlled by signals having the same bit arrangement. Therefore, a variety of BIST circuits 120 and test circuits 222 can be easily controlled. Even if the number of BIST circuits and test circuits 222 is increased, the design of the circuit and the control are simple, as long as the new BIST circuits and test circuits 222 fulfilling prescribed specifications are connected to the common bus 130. These prescribed specifications may show that the BIST circuits and the test circuits 222 can be controlled by a signal having the bit arrangement of the intra-device control signal or the intra-tester control signal described above.

The cycle generating section 228 generates the test cycle based on the test program. For example, the cycle generating section 228 generates a reference clock having a period corresponding to a value recorded in the test program. The cycle generating section 228 may supply the generated reference clock to the test circuits 222 and the synchronization control section 230. The test circuits 222 operate according to the test cycle. For example, the test circuits 222 output the test signal in synchronization with the test cycle.

The synchronization control section 230 controls the tester-side control section 226 to operate in synchronization with the test circuits 222 and the BIST circuits 120. For example, the synchronization control section 230 synchronizes at least a portion of the signal output by the tester-side control section 226 with the test cycle. For example, the synchronization control section 230 retimes a portion of the signal output by the tester-side control section 226 with the test cycle. By this process, the tester-side control section 226 generates the external signal and the intra-tester signal in synchronization with the test cycle.

In the manner described above, the circuit block 220 of the present embodiment can synchronize the intra-device control signal output by the device control section 122 with the intra-tester control signal, thereby synchronizing the operation of the test circuits 222 and the BIST circuits 120. In other words, the BIST circuits 120 and the test circuits 222 can work together to test the operation circuits 102, thereby enabling the performance of a variety of tests.

For example, the BIST circuits 120 may test the operation circuits 102 after the test circuits 222 supply the prescribed test signals to the operation circuits 102 to set the operation circuits 102 to prescribed logic states. As another example, the test circuits 222 change the logic states of the operation circuits 102 while the BIST circuits 120 are testing the operation circuits 102.

As yet another example, the test circuits 222 may test the operation circuits 102 after the BIST circuits 120 set the operation circuits 102 to prescribed logic states. Similarly, the BIST circuits 120 may change the states of the operation circuits 102 while the test circuits 222 are testing the operation circuits 102.

The tester-side control section 226 outputs the external signal and the intra-tester control signal to cause the BIST circuits 120 and the test circuits 222 to operate in synchronization, as described above. Through this control, the test circuits 222 can perform testing with a variety of methods.

Figure 3:
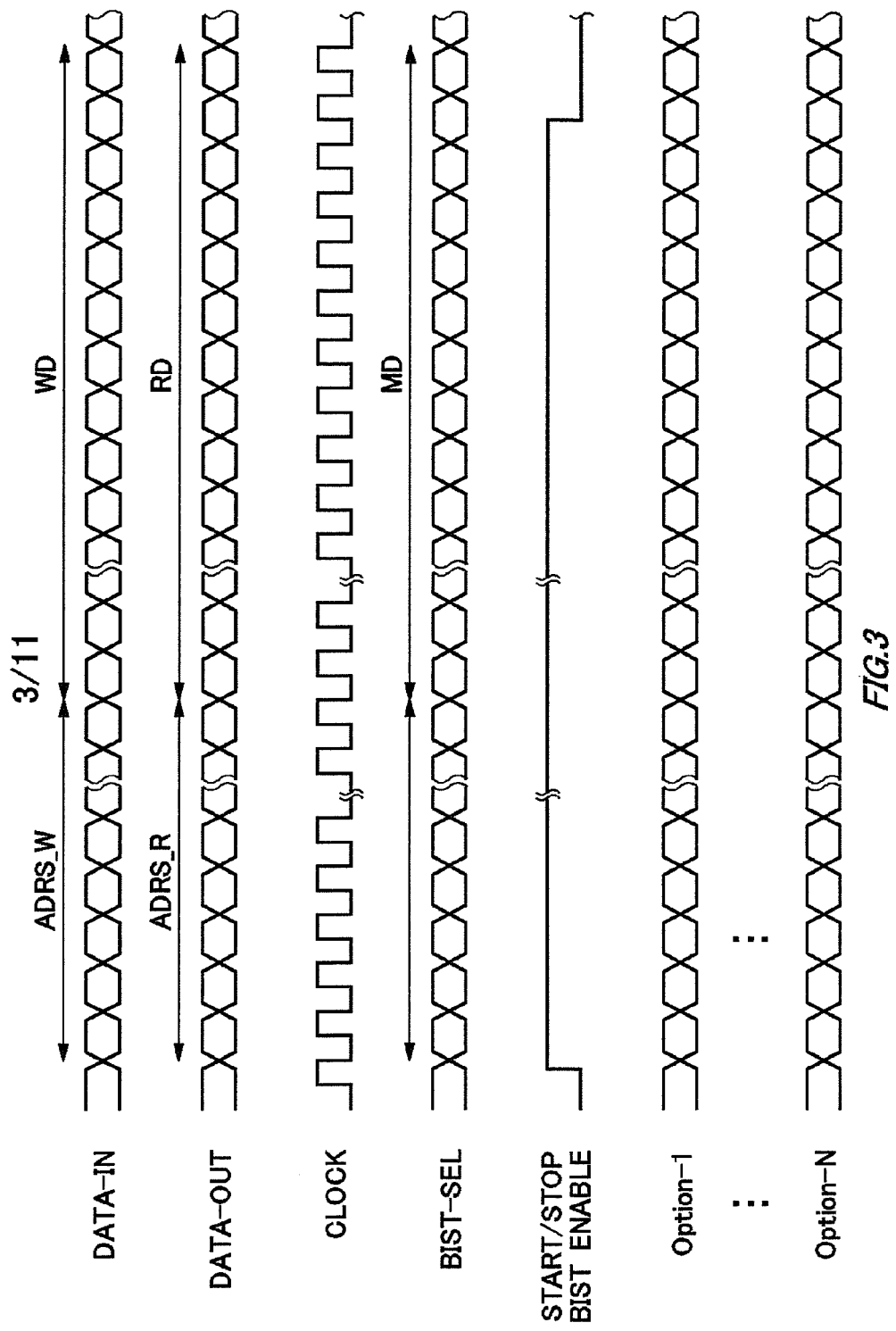
FIG. 3 shows exemplary bit configurations of the intra-tester control signal.

FIG. 3 shows exemplary bit configurations of the intra-tester control signal. The intra-tester signal described above includes an input bit DATA-IN, an output bit DATA-OUT, a clock bit CLOCK, a designation bit BIST-SEL, and an enable bit ENABLE. In addition to these bits, the intra-tester control signal may further include optional bits Option to be used by a user.

The external signal and the intra-tester control signal may have the same bit configuration as the intra-tester control signal. These bits may be transmitted in parallel, as shown in FIG. 3, or may be transmitted serially. For example, the intra-tester control signal and the intra-device control signal may be signals that transmit the bits in parallel, and the external signal may be a signal that transmits the bits serially. This allows the number of test pins 144 to be decreased.

The bits in the external signal and the intra-tester signal may be synchronized with the test cycle by the synchronization control section 230. In this way, the external signal and the intra-tester signal can be synchronized with each other.

The designation bit BIST-SEL may include a portion that indicates the address of the designated BIST circuit 120 and a portion that indicates the operational mode of the designated BIST circuit 120. The operational mode portion of the designation bit BIST-SEL may indicate when the designated BIST circuit 120 begins or ends operation. If the BIST circuit 120 has a plurality of operational modes, the operational mode portion of the designation bit BIST-SEL may designate the operational mode of the BIST circuit 120. For example, the BIST circuit 120 may have a plurality of operational modes having different operational frequencies.

The input bit DATA-IN may include an address portion and a data portion. The address portion may indicate an address in the BIST circuit 120. The data portion may indicate the data to be supplied to the indicated address.

Similarly, the output bit DATA-OUT may include an address portion and a data portion. The address portion may indicate an address in the BIST circuit 120. The data portion may indicate the data read from the indicated address.

Figure 4:
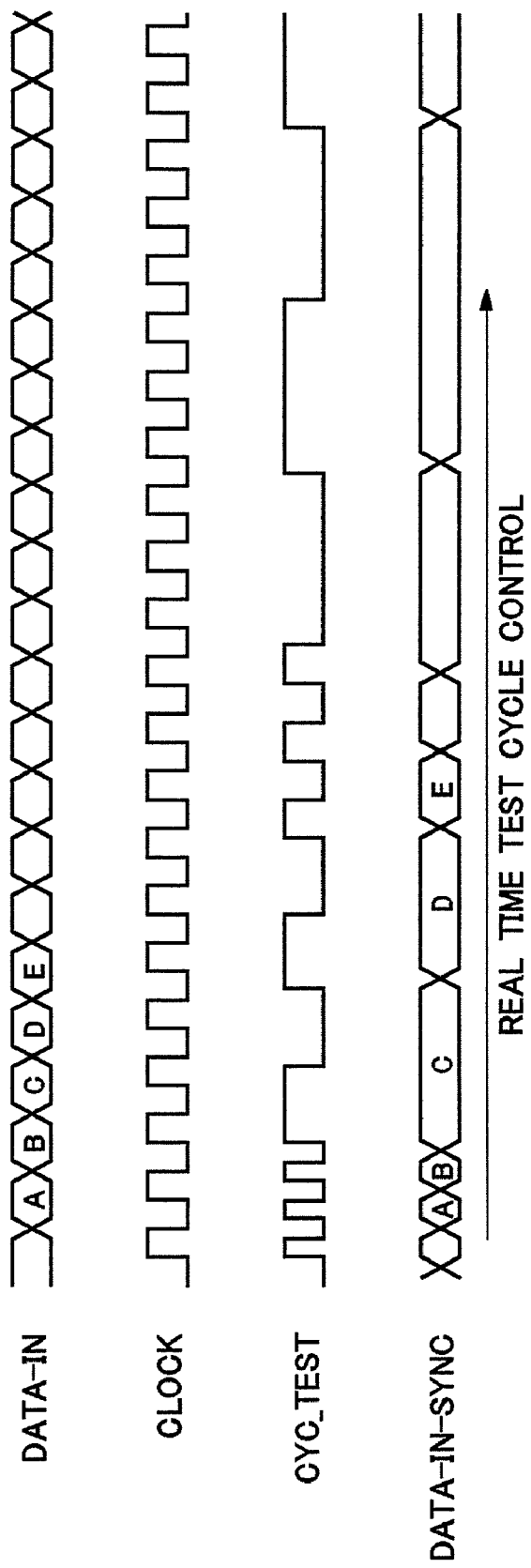
FIG. 4 is a timing chart showing exemplary operations of the synchronization control section 230 and the tester-side control section 226.

FIG. 4 is a timing chart showing exemplary operations of the synchronization control section 230 and the tester-side control section 226. The test apparatus 200 described in relation to FIG. 3 supplies the devices under test 110 with the input bit DATA-IN having a constant bit length, but the test apparatus 200 of the present embodiment supplies the devices under test 110 with an input bit DATA-IN-SYNC having a changing bit length.

The length of each input bit may be set according to the test cycle CYC-TEST designated by the test program. The test cycle CYC-TEST may be generated by the cycle generating section 228 based on the test program.

The synchronization control section 230 receives the input bit DATA-IN from the tester-side control section 226 and outputs a synchronized input bit DATA-IN-SYNC in which the timing of each bit corresponds to the test cycle CYC-TEST. In other words, the synchronization control section 230 changes the bit length of each input bit DATA-IN according to the length of the corresponding cycle in the test cycle CYC-TEST, and outputs the changed bits. The synchronization control section 230 may be a FIFO that acquires the value of each bit in the input bit DATA-IN according to the reference clock CLOCK and outputs the acquired values according to the test cycle CYC-TEST.

The tester-side control section 226 may change the synchronized input bit output by the synchronization control section 230 into the input data bit DATA-IN described in relation to FIG. 3, and output this input data bit DATA-IN. In this way, the test circuits 222 and the BIST circuits 120 can both operate in synchronization with the test cycle.

Figure 5:
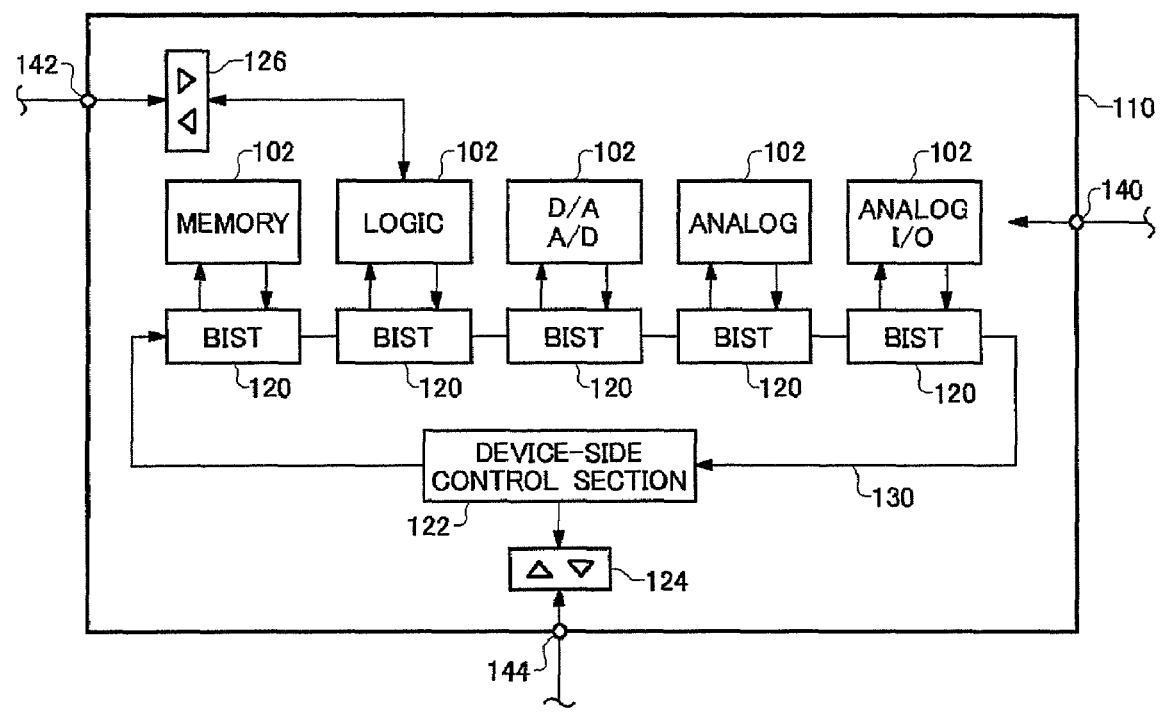
FIG. 5 shows another exemplary configuration of a device under test 110.

FIG. 5 shows another exemplary configuration of a device under test 110. FIG. 2 shows an example in which the BIST circuits 120 are connected in parallel to the device control section 122 via the common bus 130, but the BIST circuits 120 of the present embodiment are connected serially to the device control section 122 via the common bus 130. The BIST circuits 120 may be connected to the device control section 122 with a bus connection, such as a ring connection, a tree connection, or a star connection.

Figure 6:
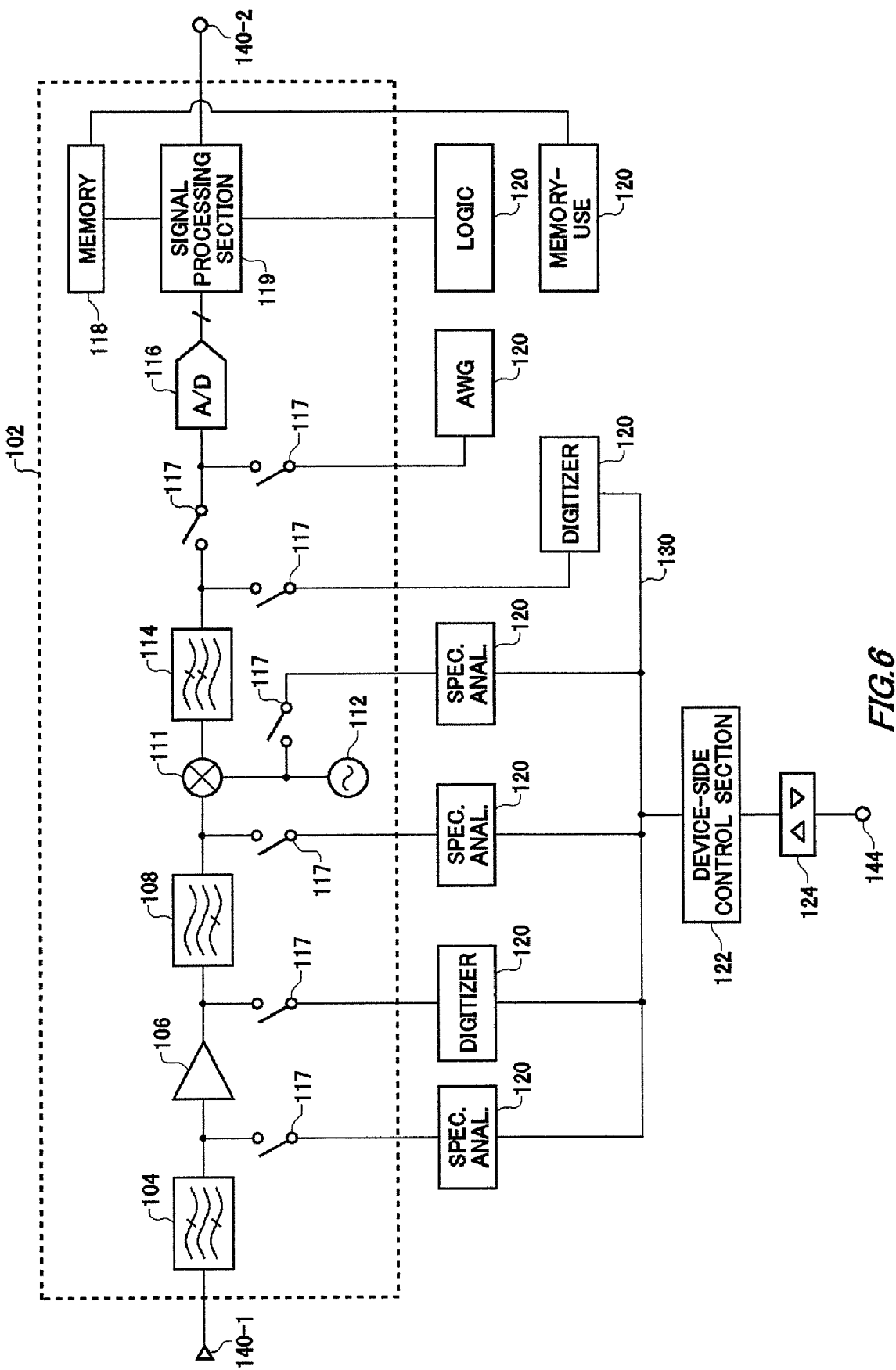
FIG. 6 shows an exemplary configuration of the operation circuit 102.

FIG. 6 shows an exemplary configuration of the operation circuit 102. The operation circuit 102 of the present embodiment may include super heterodyne receiving circuits. The operation circuit 102 of the present embodiment may be a circuit achieved by connecting the various types of operation circuits 102 described in relation to FIGS. 1 to 5. Therefore, the operation circuit 102 of the present embodiment may be tested by a plurality of types of BIST circuits 120.

The operation circuit 102 includes a memory circuit 118, a signal processing section 119, an A/D converter 116, a LPF 114, a mixer 111, a local oscillator 112, an image removing filter 108, a low noise amplifier (LNA) 106, and a band-pass filter (BPF) 104. Each element of the operation circuit 102 may be connected via a switch 117 to a BIST circuit 120 having a function corresponding to the element.

An input signal RFin may be input to the operation pin 140-1. The input signal RFin may be supplied from the test circuit 222. The BPF 104 allows a signal component of the input signal RFin in a prescribed frequency band to pass through. This frequency band may be centered on the carrier frequency of the input signal RFin.

The LNA 106 generates an internal signal RF2 by amplifying an internal signal RF1 filtered by the BPF 104. To avoid image interference in the mixer 111 at a later stage, the image removing filter 108 attenuates the image component of the internal signal RF2 to generate an internal signal RF3. The image removing filter 108 may be a low-pass filter.

The local oscillator 112 generates a local signal by oscillating with a prescribed local frequency. The mixer 111 performs a down conversion by mixing the local signal with the internal signal RF3 output by the image removing filter 108.

If the input signal RFin is quadrature modulated, the mixer 111 outputs the in-phase component BB_I and the quadrature component BB_Q of the analog baseband signal. The analog baseband signal BB is filtered by the LPF 114 and converted to a digital value by the A/D converter 116. The output of the A/D converter 116 is input into the signal processing section 119 to be demodulated.

As described above, each element in the operation circuit 102 is connected to a BIST circuit 120 having a corresponding function. For example, the BPF 104, the image removing filter 108, and the local oscillator 112 are connected to BIST circuits 120 having a function of a spectrum analyzer that measures the frequency component of the signal. Each of these BIST circuits 120 may test whether a frequency characteristic of the corresponding circuit fulfills a preset specification.

The LNA 106 and the LPF 114 may be connected to BIST circuits 120 that have a function of a digitizer. Each of these BIST circuits 120 may test whether a waveform output by the corresponding circuit fulfills a preset specification.

The A/D converter 116 may be connected to a BIST circuit 120 that has a function of a waveform generator. This BIST circuit 120 may judge whether the A/D converter 116 is defective based on the output of the A/D converter 116 when supplied with a prescribed analog waveform. In this case, the digital value output by the A/D converter 116 may be measured by the test circuit 222 via the signal processing section 119 and the operation pin 140-2.

The BPF 104, the image removing filter 108, and the local oscillator 112 are connected to BIST circuits 120 that have a function of a spectrum analyzer. In this way, elements that are connected to BIST circuits 120 having the same function may use the same BIST circuit 120 by switching the connection between BIST circuit 120 and the corresponding elements, thereby enabling testing of these elements.

Figure 7:
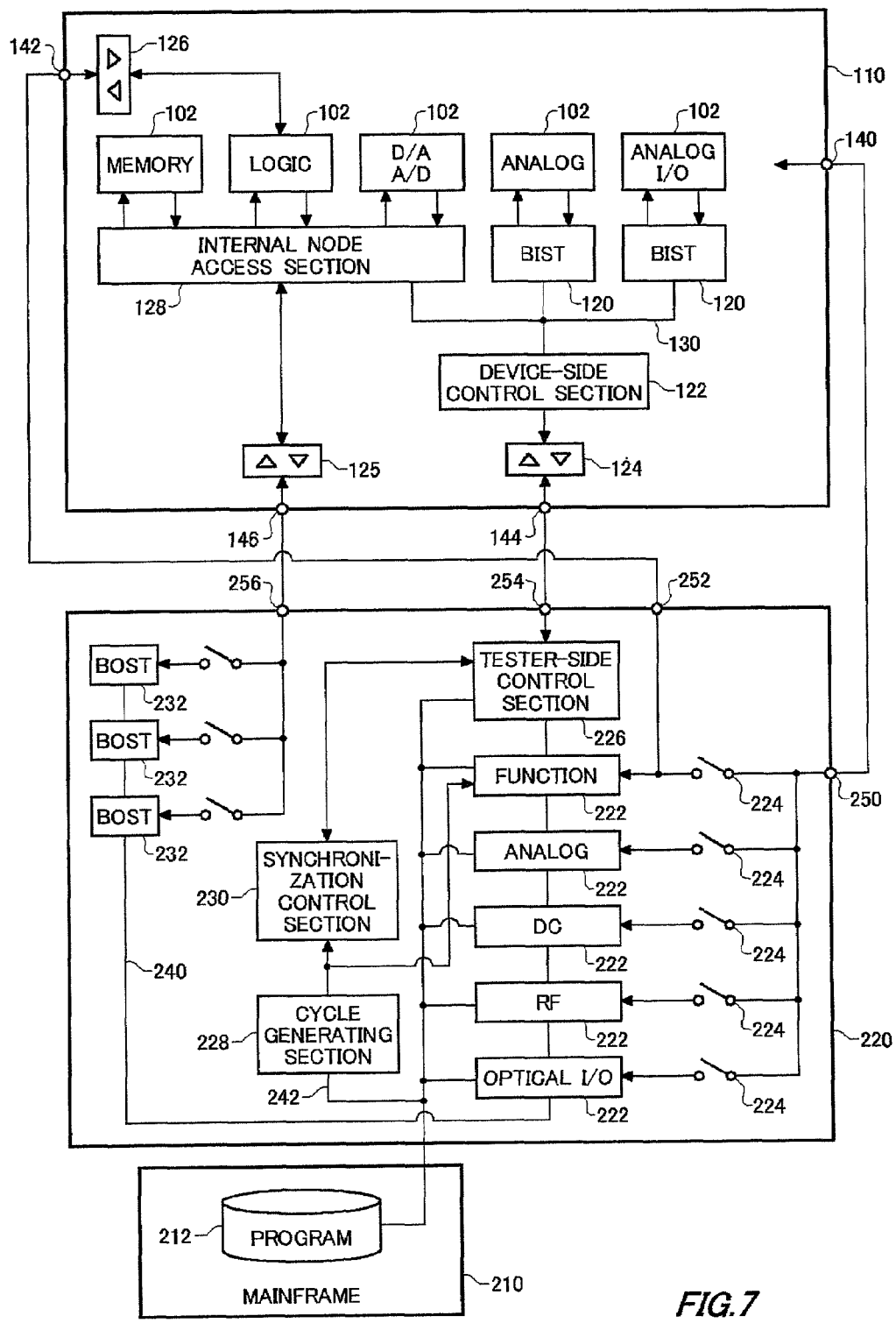
FIG. 7 shows another exemplary configuration of a device under test 110 and a circuit block 220.

FIG. 7 shows another exemplary configuration of a device under test 110 and a circuit block 220. The device under test 110 of the present embodiment is different from the device under test 110 described in relation to FIGS. 1 to 6 in that the device under test 110 of the present embodiment includes an internal node access section 128 and an interface 125. Other elements of the device under test 110 are the same as the elements of the device under test 110 described in relation to FIGS. 1 to 6.

The internal node access section 128 and the interface 125 may be provided in place of a BIST circuit 120 that tests a digital circuit, from among the BIST circuits 120 described in relation to FIGS. 1 to 6. The internal node access section 128 is electrically connected to a prescribed plurality of nodes inside the corresponding operation circuit 102.

The interface 125 is electrically connected to the internal node access section 128 and the circuit block 220 via the test pin 146. The internal node access section 128 may be electrically connected to a plurality of test pins 146. The internal node access section 128 may switch which nodes in which operation circuits 102 each test pin 146 is connected to.

The internal node access section 128 may be an internal test circuit. The device control section 122 may control the internal node access section 128 to switch which nodes the test pin 146 is connected to.

The circuit block 220 of the present embodiment includes a plurality of BOST circuits 232 in addition to the configuration of the circuit block 220 described in relation to FIGS. 1 to 6. Other elements of the circuit block 220 may be the same as the elements of the circuit block 220 described in relation to FIGS. 1 to 6.

Each BOST circuit 232 may have the same function and configuration as a BIST circuit 120 having a digital circuit as described in relation to FIGS. 1 to 6. The BOST circuits 232 are connected to the common bus 240 in the same manner as the test circuits 222. The tester-side control section 226 may control each BOST circuit 232 using an internal test control signal. In this case, the tester-side control section 226 may designate each BOST circuit 232 with a designation bit in the internal test control signal.

The BOST circuits 232 are connected to the test pin 146 via the I/O pin 256. The BOST circuits 232 test the operation circuits 102 via the internal node access section 128.

In this way, by providing the circuit block 220 with BOST circuits 232 having the same function as the BIST circuits 120, the area taken up by the BIST circuits 120 in the device under test 110 can be decreased. Furthermore, since the circuit blocks 220 are formed on the test substrate 202 positioned near the wafer under test 100, the BOST circuits 232 can be arranged inside the circuit blocks 220. Therefore, the BOST circuits 232 and the test circuits 222 can be easily synchronized with each other. Furthermore, since the BOST circuits 232 are near the device under test 110, providing a driver circuit or the like between the BOST circuits 232 and the device under test 110 becomes unnecessary.

Figure 8:
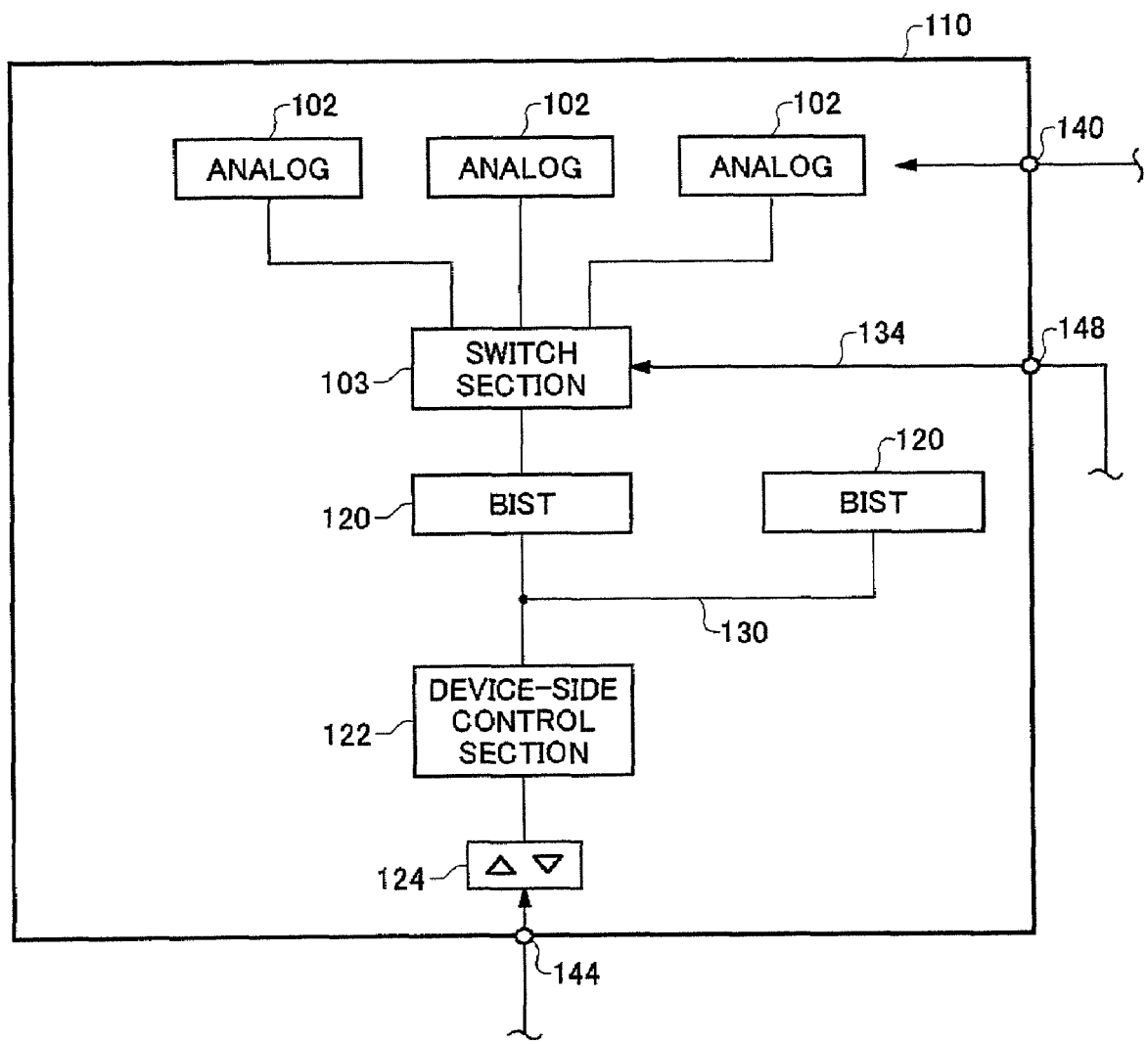
FIG. 8 shows another exemplary configuration of a device under test 110.

FIG. 8 shows another exemplary configuration of a device under test 110. The device under test 110 of the present embodiment further includes a switch section 103 and a calibration pin 148 in addition to the configuration of the device under test 110 described in relation to FIGS. 1 to 7. Other elements of the device under test 110 may be the same as the elements of the device under test 110 described in relation to FIGS. 1 to 7.

The switch section 103 is provided between a prescribed BIST circuit 120 and a plurality of operation circuits 102, and switches which operation circuit 102 the BIST circuit 120 is connected to. The switch section 103 may be an internal test circuit. The device control section 122 may control which operation circuit 102 the switch section 103 selects according to the portion showing the operational mode in the designation bit of the intra-device control signal described above.

The plurality of operation circuits 102 may be circuits that are testable by the same BIST circuit 120. For example, the plurality of operation circuits 102 may be the BPF 104, the image removing filter 108, and the local oscillator 112 shown in FIG. 6. In this case, the BIST circuit 120 connected to the switch section 103 may have the function of a spectrum analyzer. With such a configuration, the number of BIST circuits 120 can be decreased.

Each BIST circuit 120 is desirably calibrated in advance to cause certain characteristics to be prescribed values. These characteristics include the timing at which the signal is output, the amplitude of the output signal, the relation between the input signal and the measured value, and the like.

For example, when a prescribed calibration signal is supplied to the operation circuit 102 via the calibration pin 148 and the switch section 103, the circuit block 220 may adjust the circuit characteristics in the BIST circuit 120, such as the input/output gain, such that the measurement value obtained by the BIST circuit 120 is a prescribed value. The device control section 122 may use an input bit of the intra-device control signal to designate an address of the adjustment target portion of the BIST circuit 120 and supply data for adjusting the characteristics of this target portion.

Figure 9:
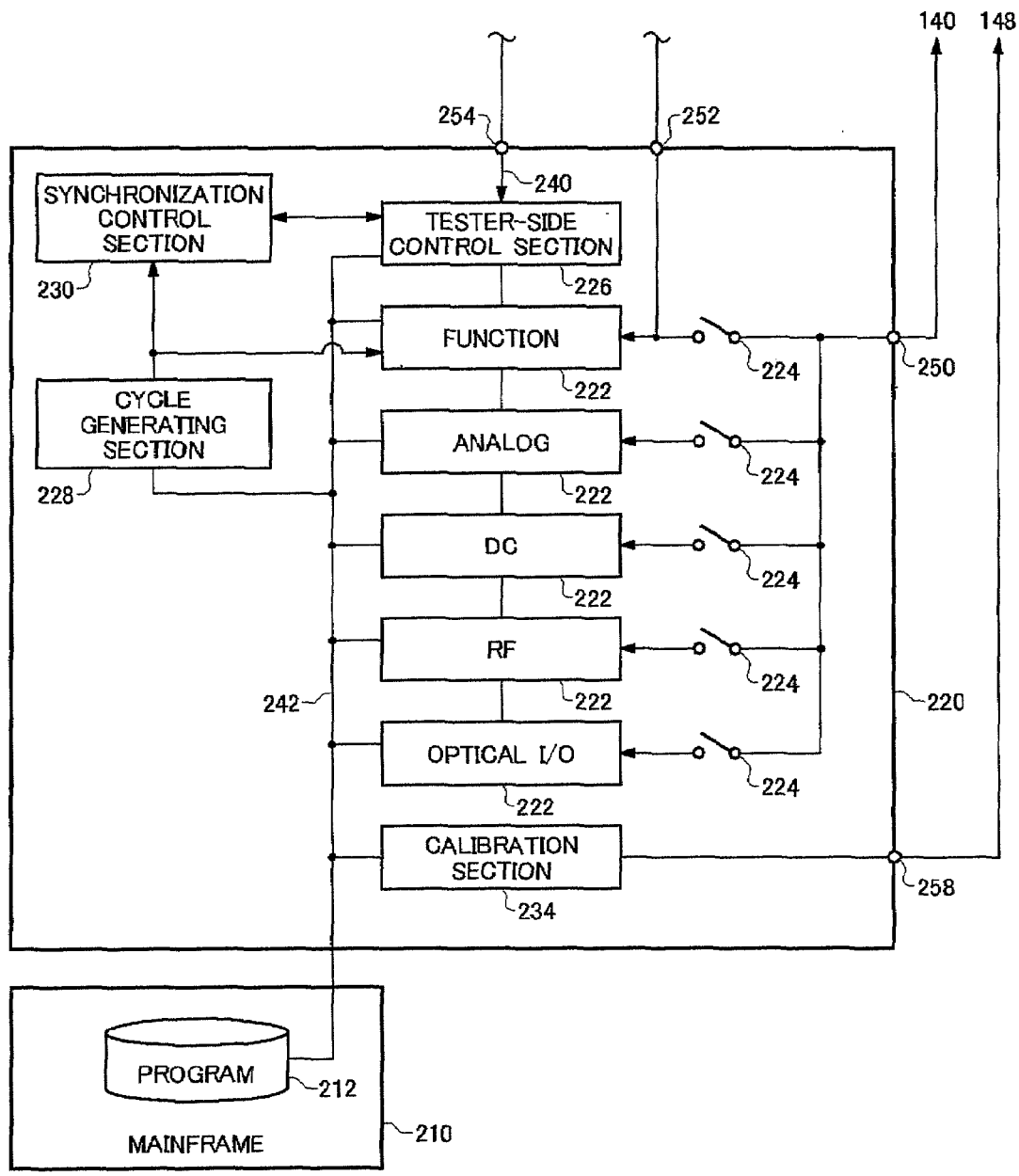
FIG. 9 shows an exemplary configuration of the circuit block 220.

FIG. 9 shows an exemplary configuration of the circuit block 220. The circuit block 220 of the present embodiment further includes a calibration section 234 in addition to the configuration of the circuit block 220 described in relation to FIGS. 1 to 7. The calibration section 234 is electrically connected to the calibration pin 148 of the device under test 110 via the I/O pin 258.

The calibration section 234 may supply the operation circuit 102 with the prescribed calibration signal via the calibration pin 148. The tester-side control section 226 may receive the signal output by the operation circuit 102 in response to the calibration signal as the measurement result of the BIST circuit 120. The tester-side control section 226 may generate an external signal for adjusting the BIST circuit 120 based on the measurement result. For example, the tester-side control section 226 generates the external signal that minimizes the difference between the measurement result and a preset expected value.

Figure 10:
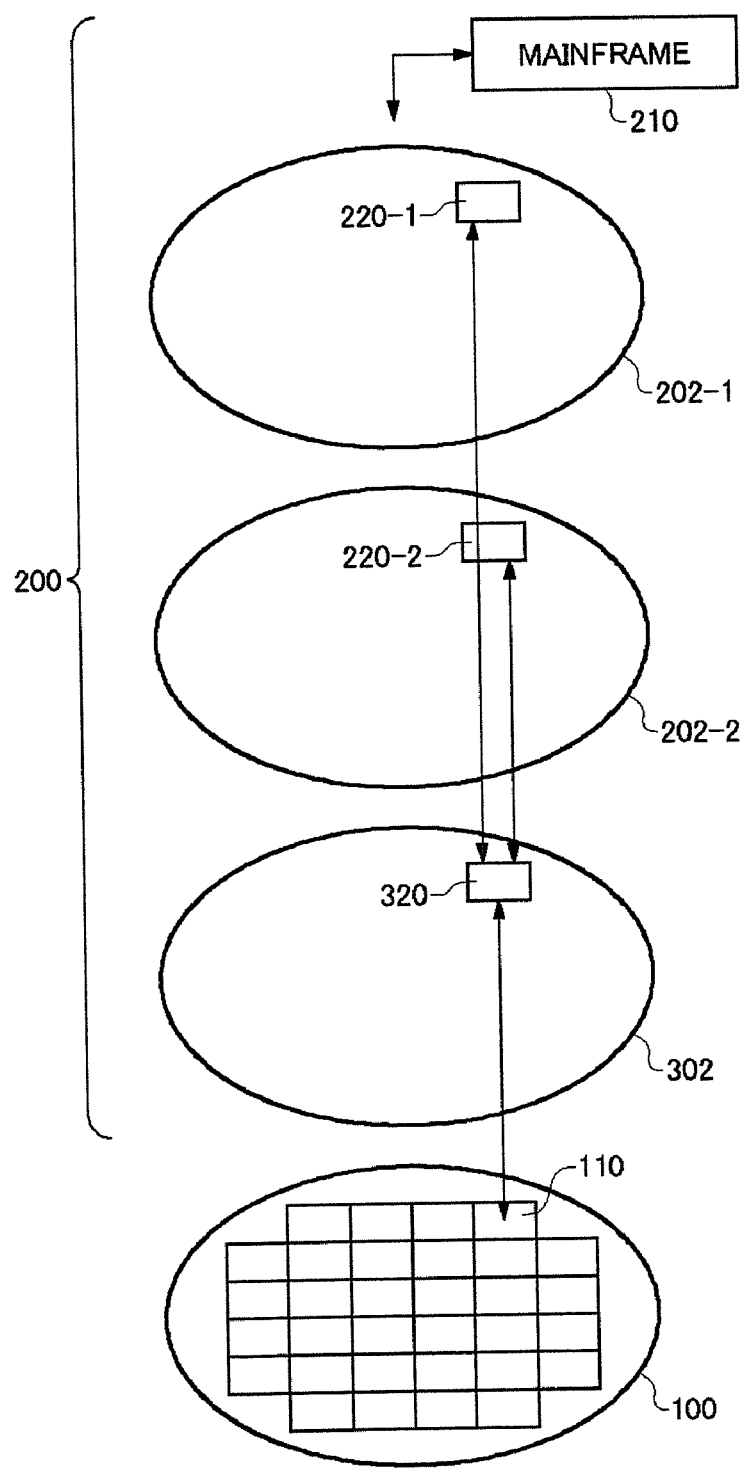
FIG. 10 shows another exemplary configuration of the test apparatus 200.

FIG. 10 shows another exemplary configuration of the test apparatus 200. The test apparatus 200 of the present embodiment includes a connection substrate 302 and a plurality of test substrates 202. In FIG. 10, a test apparatus 200 having two test substrates 202 is used as an example.

The test substrates 202 and the connection substrate 302 may each be formed with the same semiconductor material as the wafer under test 100. For example, these substrates are silicon wafers. The test substrates 202 and the connection substrate 302 may each have substantially the same diameter as the wafer under test 100. The test apparatus 200 of the present embodiment uses a semiconductor wafer with a diameter substantially equal to that of the wafer under test 100 as the connection substrate 302, and the connection substrate 302 is electrically connected to a plurality of devices under test 110 en masse.

The test substrates 202 and the connection substrate 302 may each have a plurality of the circuit blocks 220 described in relation to FIGS. 1 to 9 formed on a portion thereof. For example, a plurality of test circuits 222 having preset functions for each wafer are formed on each test substrate 202 to correspond with the plurality of devices under test 110.

Different test substrates 202 may have test circuits 222 with different functions formed thereon. For example, test circuits 222-1 that perform a DC test of the devices under test 110 are formed on a first test substrate 202-1 to correspond one-to-one with the devices under test 110. Furthermore, test circuits 222-2 that perform an analog test of the devices under test 110 are formed on a second test substrate 202-2 to correspond one-to-one with the devices under test 110. In FIG. 10, each test substrate 202 is shown as having one test circuit 222 corresponding to one device under test 110 and other test circuits 222 are not displayed.

The test substrates 202 are arranged in a layered formation. For example, the bottom of the first test substrate 202-1 is affixed to the top of the second test substrate 202-2 using an anisotropically conductive sheet.

The connection substrate 302 is provided between the wafer under test 100 and the test substrate 202 nearest the wafer under test 100. The connection substrate 302 of the present embodiment is provided between the wafer under test 100 and the second test substrate 202-2 to form a signal transmission path between a pad provided on the second test substrate 202-2 and a pad provided on the wafer under test 100.

The connection substrate 302 includes a plurality of connection portions 320 corresponding to the plurality of devices under test 110. Each connection portion 320 is provided with the tester-side control section 226 described in relation to FIGS. 1 to 9. Each connection portion 320 further includes a switching section 224 that selects a certain test circuit 222.

FIG. 10 shows a single connection portion 320 corresponding to a single device under test 110 but does not show the other connection portions 320.

Figure 11:
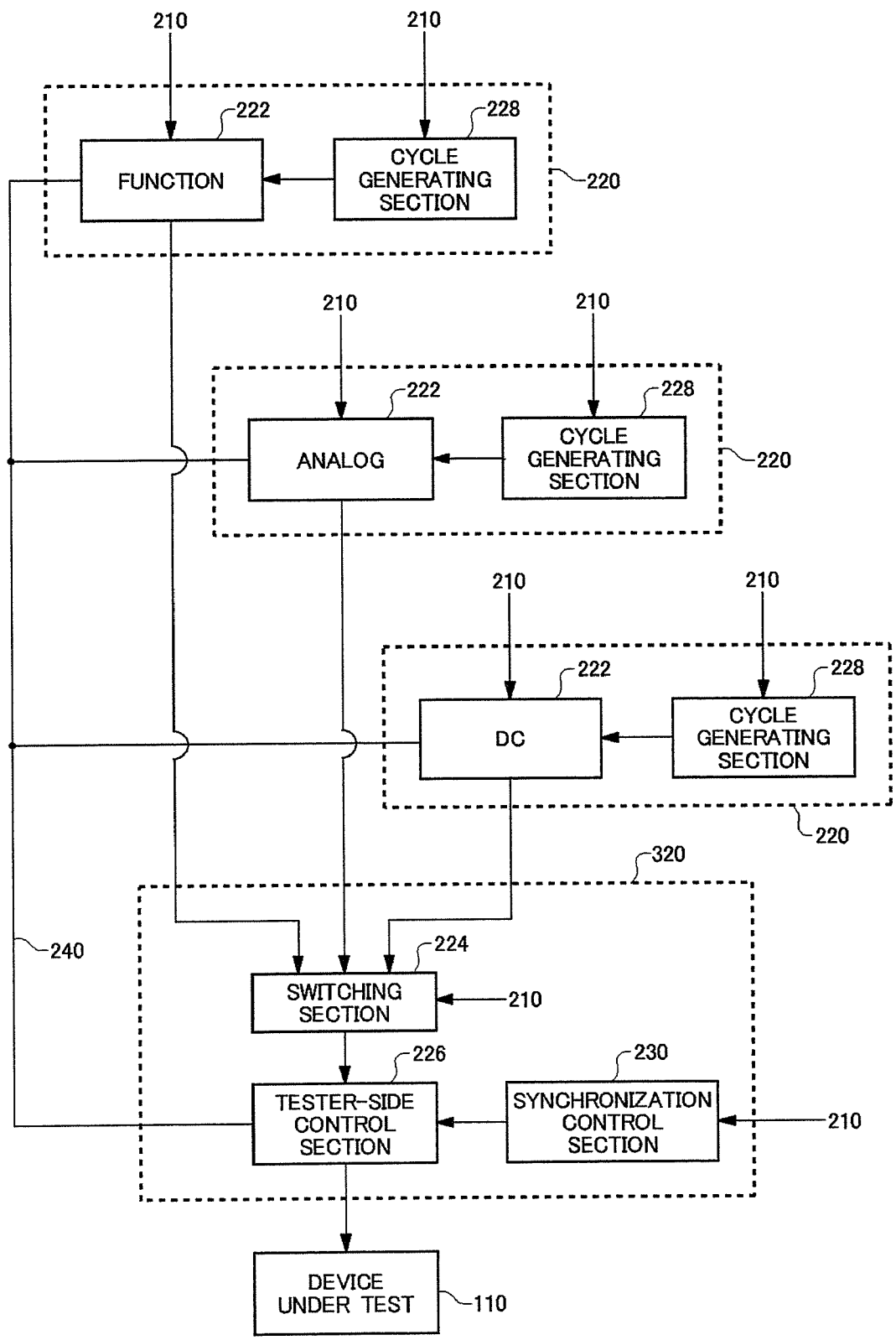
FIG. 11 shows examples of the connection portion 320 and the circuit blocks 220 provided to each test substrate 202.

FIG. 11 shows examples of the connection portion 320 and the circuit blocks 220 provided to each test substrate 202. FIG. 11 shows one of the circuit blocks 220 and the connection portion 320 provided to each test substrate 202. As described above, each test substrate 202 is provided with circuit blocks 220 having functions that are preset for each wafer.

For example, a circuit block 220-1 that performs a DC test of the device under test 110 is provided on the first test substrate 202-1, a circuit block 220-2 that performs an analog test of the device under test 110 is provided on the second test substrate 202-2, and a circuit block 220-3 that performs a function test of the device under test 110 is provided on the third test substrate 202-3.

The circuit blocks 220 provided on each test substrate 202 are not limited to the test circuits described above. The test substrates 202 may be provided with circuit blocks 220 corresponding to various tests, such as a scan test or a jitter tolerance test of the device under test 110.

Here, circuit blocks 220 provided on test substrates 202 closer to the wafer under test 100 may generate signals at higher frequencies to test the devices under test 110. For example, the circuit block 220 that performs the DC test may be provided on a test substrate 202 further from the wafer under test 100 than the test substrate 202 on which the circuit block 220 performing the high frequency analog test is provided. In other words, providing circuit blocks 220 that test the devices under test 110 using high frequency signals near the devices under test 110 decreases the transmission length of the high frequency signals, which enables more accurate testing of the devices under test 110.

The connection portion 320 connects the circuit blocks 220 provided on a certain test substrate 202 to the corresponding devices under test 110, as described above. The connection portion 320 may include a switching section 224, a tester-side control section 226, and a synchronization control section 230.

The switching section 224 selects the test circuit 222 of a certain test substrate 202 based on a control signal supplied form the mainframe or the like. For example, the switching section 224 may provide a transmission path between the test circuit 222 on the selected test substrate 202 and the device under test 110. The switching section 224 may connect the selected test circuit 222 to the device under test 110 via the tester-side control section 226, or may connect the selected test circuit 222 to the operation pin of the device under test 110 without using the tester-side control section 226.

The tester-side control section 226 generates the external signal and the intra-tester control signal, as described in relation to FIGS. 1 to 9. The synchronization control section 230 synchronizes the external signal and the intra-tester control signal generated by the tester-side control section 226 with the test cycle.

The tester-side control section 226 is electrically connected to the corresponding test circuit 222 in each test substrate 202 via the common bus 240. The common bus 240 may be a via hole formed through the plurality of test substrates 202. The tester-side control section 226 may output the intra-tester control signal to the common bus 240.

The tester-side control section 226 supplies the external signal to the test pin of the device under test 110. With this configuration as well, the test circuits 222 and the BIST circuits 120 can be synchronized. Each circuit block 220 and the connection portion 320 may be provided with the cycle generating section 228 that generates the test cycle designated by the test program.

The switching section 224 may be electrically connected to the test circuit 222 provided on each test substrate 202. In this case, a via hole is formed in each test substrate 202 to form a bypass connection from the test circuit 222 provided on the test substrate 202 furthest from the connection substrate 302 to the test substrate 202 closest to the connection substrate 302. For example, the test circuit 222 provided on the first test substrate 202-1 is electrically connected to the switching section 224 through a via hole formed in the second test substrate 202-2.

The switching section 224 may be connected to a plurality of corresponding test circuits 222 through a plurality of via holes. The switching section 224 may then electrically connect the corresponding device under test 110 to a certain single test circuit 222 through a certain via hole.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention enable a plurality of types of BIST circuits, test circuits, and BOST circuits to operate in synchronization. Furthermore, the embodiments of the present invention enable the circuits above to be controlled by a shared signal.

What is claimed is:

1. A test system that tests a device under test, comprising:
    a plurality of internal test circuits that are provided inside the device under test and that are used for testing an operation circuit of the device under test;
    a device control section that is electrically connected to the plurality of internal test circuits via a common bus and that controls the plurality of internal test circuits by supplying the common bus with an intra-device control signal corresponding to a received external signal; and
    a test apparatus that supplies the device control section with the external signal,
    wherein the test apparatus includes:
        a test circuit that tests the operation circuit; and
        a synchronization control section that causes the test circuit and the internal test circuits to operate in synchronization,
    the test system tests a plurality of the devices under test formed in a wafer under test,
    the test apparatus further includes a test substrate that is arranged facing the wafer under test and on which is formed a plurality of circuit blocks corresponding to the plurality of devices under test, and
    each circuit block includes the test circuit and the synchronization control section, and tests a corresponding device under test.

2. The test system according to claim 1, wherein
    the test apparatus further includes a tester-side control section that supplies the device control section with the external signal,
    the test circuit operates according to a preset test cycle, and
    the synchronization control section synchronizes the external signal generated by the tester-side control section with the test cycle.

3. The test system according to claim 2, wherein
    the tester-side control section generates an intra-tester control signal having a bit configuration that is substantially the same as a bit configuration of the intra-device control signal, to further control the test circuit.

4. The test system according to claim 3, wherein
    the tester-side control section generates the external signal that causes the internal test circuits to test the operation circuit, after the test circuit sets the operation circuit to a prescribed state.

5. The test system according to claim 4, wherein
    the device under test further includes:
        an operation pin that performs input and output of a signal between the operation circuit and the outside of the device under test; and
        a test pin that performs input and output of a signal between the device control section and the outside of the device under test,
    the tester-side control section performs input and output of a signal to and from the device control section via the test pin, and
    the test circuit performs input and output of a signal to and from the operation circuit via the operation pin.

6. The test system according to claim 5, wherein
    at least one of the internal test circuits includes an analog circuit that performs input and output of an analog signal,
    the device under test further includes a calibration pin that is connected to the internal test circuit including the analog circuit, and
    the test apparatus supplies the internal test circuit with a calibration signal via the calibration pin.

7. The test system according to claim 1, wherein
    the test apparatus further includes a BOST circuit that is formed on the test substrate and that tests the operation circuit via the test pins provided on the devices under test.

* * * * *